(12) United States Patent
Zhao et al.

(10) Patent No.: US 8,031,099 B2
(45) Date of Patent: Oct. 4, 2011

(54) ANALOG/DIGITAL OR DIGITAL/ANALOG CONVERSION SYSTEM HAVING IMPROVED LINEARITY

(75) Inventors: Lijie Zhao, Shanghai (CN); Qinghua Yue, Shanghai (CN); Gao Song, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/645,488

(22) Filed: Dec. 23, 2009

(65) Prior Publication Data

US 2011/0148675 A1    Jun. 23, 2011

(51) Int. Cl.
 *H03M 1/66* (2006.01)
(52) U.S. Cl. ........................ 341/150; 327/534
(58) Field of Classification Search .......... 341/118–172; 327/534
 See application file for complete search history.

(56) References Cited

U.S. PATENT DOCUMENTS

| | | | | |
|---|---|---|---|---|
| 5,684,487 A | * | 11/1997 | Timko | 341/172 |
| 5,745,194 A | * | 4/1998 | Nakashima et al. | 349/38 |
| 6,255,909 B1 | * | 7/2001 | Muza | 330/264 |
| 6,437,720 B1 | * | 8/2002 | Yin et al. | 341/150 |
| 6,630,834 B2 | * | 10/2003 | Min et al. | 324/676 |
| 6,977,607 B2 | * | 12/2005 | Leung et al. | 341/172 |
| 7,821,433 B2 | * | 10/2010 | Abe | 341/118 |
| 2004/0257256 A1 | * | 12/2004 | Leung et al. | 341/172 |
| 2009/0243901 A1 | * | 10/2009 | Abe | 341/118 |

* cited by examiner

*Primary Examiner* — Lam T Mai
(74) *Attorney, Agent, or Firm* — Bever, Hoffman & Harms

(57) ABSTRACT

A digital-to-analog converter (DAC) circuit includes a least significant bit (LSB) set of capacitors, each commonly coupled to an LSB node, and a most significant bit (MSB) set of capacitors, each coupled to an MSB node. A section-coupling capacitor couples the LSB and MSB nodes. The LSB node exhibits a parasitic capacitance, which tends to introduce a jump error voltage. Digital input signals are applied to the LSB and MSB capacitors, and in response, an analog output signal is developed on the MSB node. A compensation capacitor coupled to the MSB node has a compensation capacitance selected to offset the jump error voltage introduced by the parasitic capacitance. The compensation capacitor is enabled when all of the LSB capacitors are coupled to digital input signals having a logic '0' state. Otherwise, the compensation capacitor is disabled (e.g., left in a floating state).

17 Claims, 10 Drawing Sheets

ANALOG/DIGITAL OR DIGITAL/ANALOG CONVERSION SYSTEM HAVING IMPROVED LINEARITY

FIELD OF THE INVENTION

The present invention relates to analog-to-digital conversion (ADC) and/or digital-to-analog conversion (DAC) systems.

RELATED ART

FIG. 1 is a circuit diagram of a conventional successive approximation register (SAR) ADC/DAC circuit 100, which includes a two-section capacitor array. SAR ADC/DAC circuit 100 includes comparator 101, successive approximation registers (SARs) $102_X$ and $102_Y$, least significant bit (LSB) capacitor section 103, most significant bit (MSB) capacitor section 104, section coupling capacitors $C_{SX}$ and $C_{SY}$, LSB switches $S_{LX0}$-$S_{LX(K-1)}$ and $S_{LY0}$-$S_{LY(K-1)}$, MSB switches $S_{MX0}$-$S_{MX(M-1)}$ and $S_{MY0}$-$S_{MY(M-1)}$, and common mode switches $S_X$ and $S_Y$. LSB capacitor section 103 includes LSB capacitors $C_{LX0}$-$C_{LX(K-1)}$ and $C_{LY0}$-$C_{LY(K-1)}$. MSB capacitor section 104 includes MSB capacitors $C_{MX0}$-$C_{MX(M-1)}$ and $C_{MY0}$-$C_{MY(M-1)}$. Each of the LSB capacitors $C_{LX(n)}$, $C_{LY(n)}$ and each of the MSB capacitors $C_{MX(n)}$, $C_{MY(n)}$ has a capacitance equal to $2^n \cdot C$, wherein C is a unit capacitance. Each of the section coupling capacitors $C_{SX}$ and $C_{SY}$ has a capacitance equal to the unit capacitance, C.

Parasitic capacitors/capacitances $C_{PA}$ and $C_{PB}$ exist on the output nodes A and B, respectively, of LSB capacitor section 103. Each of these parasitic capacitances $C_{PA}$ and $C_{PB}$ has a value of $C_P \cdot C$. Each of the parasitic capacitances $C_{PA}$ and $C_{PB}$ is error source that introduces a non-linear characteristic to SAR ADC/DAC circuit 100. The parasitic capacitances $C_{PA}$ and $C_{PB}$ cannot be avoided in the LSB output nodes A and B, respectively.

The combined capacitance of LSB capacitors $C_{LX0}$-$C_{LX(K-1)}$, section coupling capacitor $C_{SX}$ and the parasitic capacitor $C_{PA}$ can be represented by the following equation.

$$C_{LSB} = C \cdot (2^k - 1 + C_P)/(2^k + C_P) \qquad \text{Eq. (1)}$$

The total capacitance at the output node X can be represented by the following equations.

$$C_{TOT} = C_{LSB} + (2^m - 1) \cdot C \qquad \text{Eq. (2)}$$

$$C_{TOT} = C \cdot (2^{(k+m)} + 2^m \cdot C_P - 1)/(2^k + C_P) \qquad \text{Eq. (3)}$$

In general, SAR ADC/DAC circuit 100 operates as follows. During a sample mode, switches $S_X$ and $S_Y$ are closed, thereby applying a common mode voltage VCM to nodes X and Y, respectively. Switches $S_{LX0}$-$S_{LX(K-1)}$ and $S_{MX0}$-$S_{MX(M-1)}$ are controlled to route input voltage VIN+ to capacitors $C_{LX0}$-$C_{LX(K-1)}$ and $C_{MX0}$-$C_{MX(M-1)}$. Similarly, switches $S_{LY0}$-$S_{LY(K-1)}$ and $S_{MY0}$-$S_{MY(M-1)}$ are controlled to route input voltage VIN− to capacitors $C_{LY0}$-$C_{LY(K-1)}$ and $C_{MY0}$-$C_{MY(M-1)}$. As a result, capacitor sections 103 and 104 sample the differential input signal represented by signals VIN+ and VIN−.

Comparator 101 provides analog output voltages Q# and Q in response to the sampled differential input voltages VIN+ and VIN−, respectively. SARs $102_X$ and $102_Y$ receive these analog output voltages Q# and Q, and in response, provide digital output signals. The digital output signals provided by SAR $102_X$ are loaded into switches $S_{LX0}$-$S_{LX(K-1)}$ and $S_{MX0}$-$S_{MX(M-1)}$. Similarly, the digital output signals provided by SAR $102_Y$ are loaded into switches $S_{LY0}$-$S_{LY(K-1)}$ and $S_{MY0}$-$S_{MY(M-1)}$. The loaded digital signals cause the switches $S_{LX0}$-$S_{LX(K-1)}$, $S_{LY0}$-$S_{LY(K-1)}$, $S_{MY0}$-$S_{MY(M-1)}$ and $S_{MX0}$-$S_{MX(M-1)}$ to selectively route a positive reference voltage VRP or a negative (or ground) reference voltage VRN to the associated capacitors. As described herein, the application of the reference voltage VRP to a capacitor represents a logic '1' state, and the application of the reference voltage VRN to a capacitor represents a logic '0' state. The SARs $102_X$ and $102_Y$ iteratively modify the digital output signals in response to the analog output signals Q# and Q, until the digital output signals accurately approximate the differential input signals VIN+ and VIN−. The exact manner of operating SAR ADC/DAC circuit 100 is known to those of ordinary skill in the art.

FIG. 2 is a graph 200, which illustrates the manner in which the output voltage $V_X$ varies in response to changes in the digital signals provided by SAR $102_X$. In the illustrated example, k=3 and m=4, such that there are three LSB capacitors ($C_{LX0}$-$C_{LX2}$) and four MSB capacitors ($C_{MX0}$-$C_{MX3}$). The SAR code is illustrated as a seven bit value, which can be generally represented as 'ABCD EFG', wherein 'ABCD' represent the states of MSB capacitors $C_{MX3}$-$C_{MX0}$, respectively, and 'EFG' represent the states of LSB capacitors $C_{LX2}$-$C_{LX0}$, respectively. A logic '0' value indicates that the associated capacitor is coupled to receive the negative/ground reference voltage VRN, and a logic '1' value indicates that the associated capacitor is coupled to receive the positive reference voltage VRP. As illustrated in FIG. 2, a jump voltage, $V_{JUMP}$, exists when the SAR code is incremented from a value of 'xxx0 111' to a value of 'xxx1 000'. This jump voltage $V_{JUMP}$ is significantly greater than the voltage, LSB, which exists during other transitions of the SAR code. This jump voltage $V_{JUMP}$ thereby represents a non-linear response in the output voltage $V_X$.

The jump voltage $V_{JUMP}$ can be determined as follows. The voltage $V_X$ can be represented by the following equations, when all of the LSB capacitors $C_{LX0}$-$C_{LX(K-1)}$ are coupled to the positive reference voltage VRP, and all of the MSB capacitors $C_{MX0}$-$C_{MX(M-1)}$ are coupled to the negative/ground reference voltage VRN.

$$V_{LSB} = C_{LSB}/C_{TOT} \cdot Vr \cdot (2^k - 1)/(2^k - 1 + C_P) \qquad \text{Eq. (4)}$$

$$V_{LSB} = Vr \cdot (2^k - 1)/(2^{k+m} - 1 + 2^m \cdot C_P) \qquad \text{Eq. (5)}$$

The voltage $V_X$ can be represented by the following equations, when all of the LSB capacitors $C_{LX0}$-$C_{LX(K-1)}$ are coupled to the negative/ground reference voltage VRN, the MSB capacitor $C_{MX0}$ is coupled to the positive reference voltage VRP, and the remaining MSB capacitors $C_{MX1}$-$C_{MX(M-1)}$ are coupled to the negative/ground reference voltage VRN.

$$V_{MSB} = C/C_{TOT} \cdot Vr \qquad \text{Eq. (6)}$$

$$V_{MSB} = Vr \cdot (2^k + C_P)/(2^{k+m} - 1 + 2^m \cdot C_P) \qquad \text{Eq. (7)}$$

The jump voltage $V_{JUMP}$ can be represented by the following equations.

$$V_{JUMP} = V_{MSB} - V_{LSB} \qquad \text{Eq. (8)}$$

$$V_{JUMP} = Vr \cdot (1 + C_P)/(2^{k+m} - 1 + 2^m \cdot C_P) \qquad \text{Eq. (9)}$$

Equation (5) represents the voltage $V_X$ associated with $2^K - 1$ unit capacitances C. The voltage $V_X$ associated with a single unit capacitance C can therefore be represented by the following equations.

$$LSB = V_{LSB}/(2^K - 1) \qquad \text{Eq. (10)}$$

$$LSB = Vr/(2^{k+m} - 1 + 2^m \cdot C_P) \qquad \text{Eq. (11)}$$

The difference between the jump voltage $V_{JUMP}$ and the voltage $V_X$ associated with a single unit capacitance represents (LSB) the jump error voltage, which is defined by the following equations.

$$\Delta V_e = V_{JUMP} - LSB \quad \text{Eq. (12)}$$

$$\Delta V_e = Vr^*C_P/(2^{k+m}-1+2^m{}^*C_P) \quad \text{Eq. (13)}$$

$$\Delta V_e = C_P{}^*LSB \quad \text{Eq. (14)}$$

It would therefore be desirable to have a SAR ADC/DAC circuit that does not exhibit the jump error voltage ΔVe as defined by equation (14).

SUMMARY

Accordingly, the present invention provides a SAR ADC/DAC circuit that includes a compensation capacitor that compensates for the jump error voltage ΔVe introduced by the parasitic capacitance $C_P$.

In one embodiment, a digital-to-analog converter (DAC) circuit includes a least significant bit (LSB) set of capacitors, each commonly coupled to an LSB node, and a most significant bit (MSB) set of capacitors, each coupled to an MSB node. A section-coupling capacitor couples the LSB and MSB nodes. The LSB node exhibits a parasitic capacitance, which tends to introduce a jump error voltage. Digital input signals are applied to the LSB and MSB capacitors, and in response, an analog output signal is developed on the MSB node. A compensation capacitor coupled to the MSB node has a compensation capacitance selected to offset the jump error voltage introduced by the parasitic capacitance. The compensation capacitor is enabled (e.g., coupled to a ground supply voltage terminal) when all of the LSB capacitors are coupled to digital input signals having a logic '0' state. Otherwise, the compensation capacitor is disabled (e.g., left in a floating state). As a result, the compensation capacitor advantageously offsets the parasitic capacitance when all of the LSB capacitors transition to a logic '0' state.

The present invention will be more fully understood in view of the following description and drawings.

DETAILED DESCRIPTION

Figure 1:
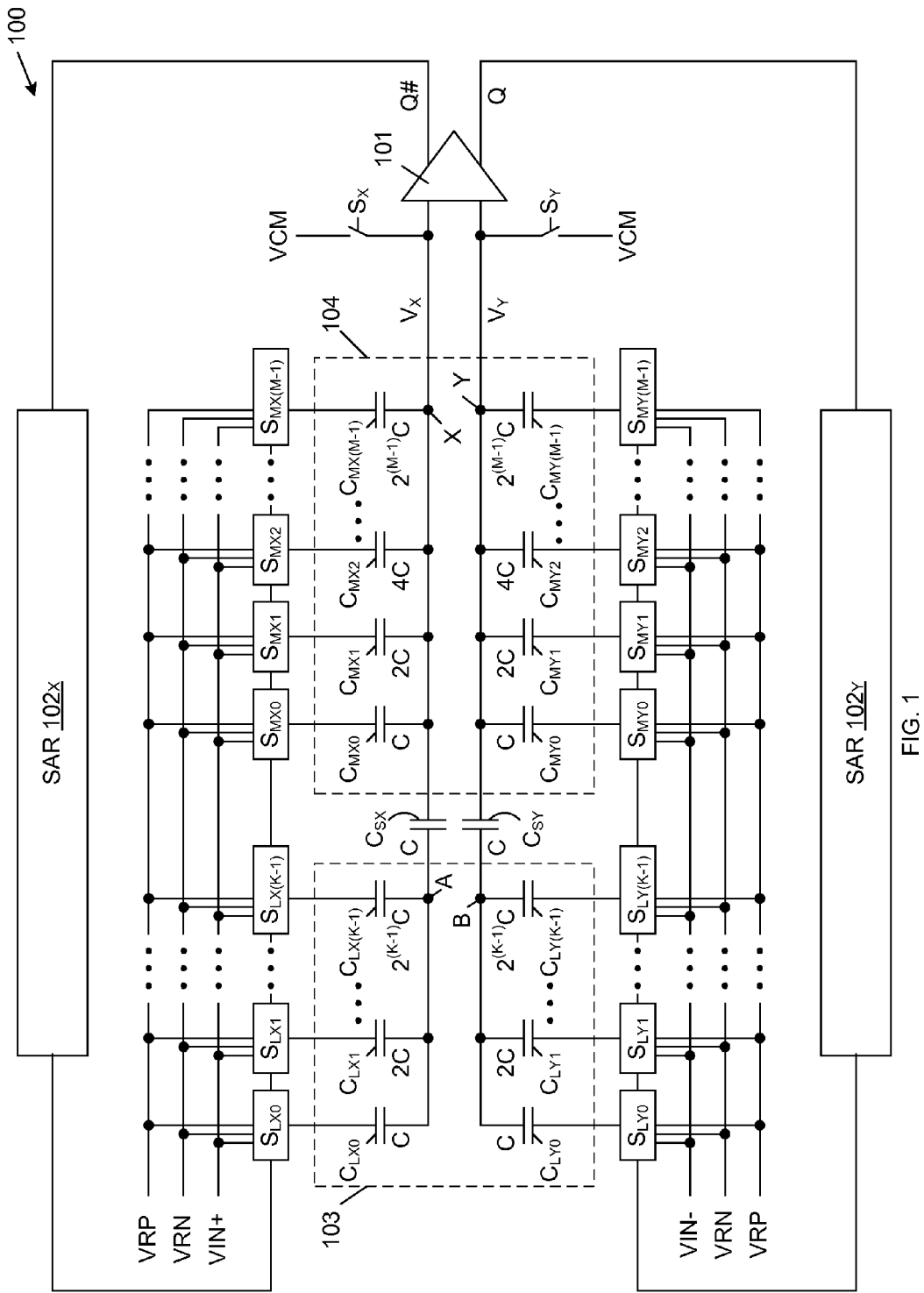
FIG. 1 is a block diagram of a conventional SAR ADC/DAC circuit.
Figure 2:
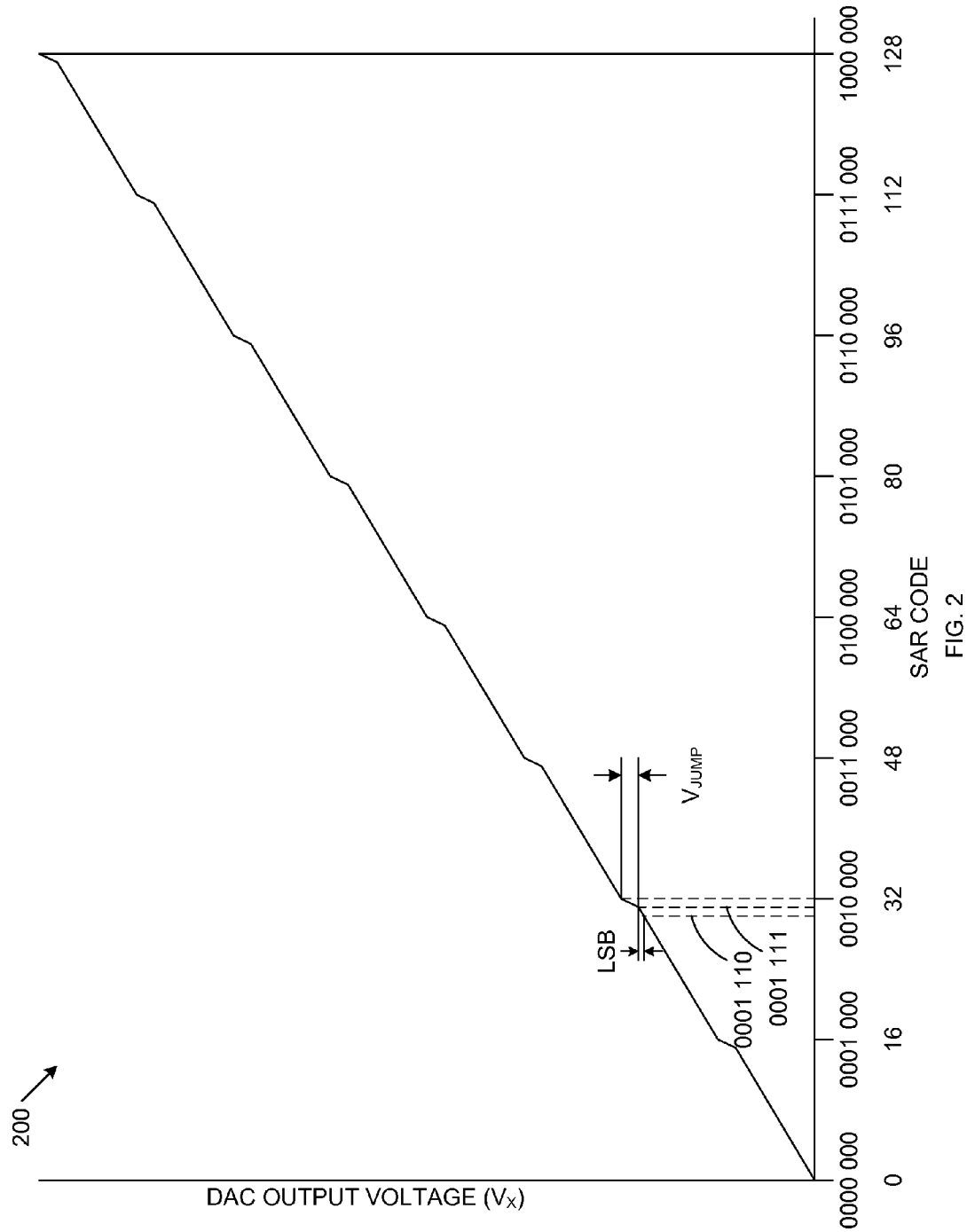
FIG. 2 is a graph, which illustrates the manner in which an output voltage $V_X$ varies in response to changes in a SAR code in the SAR ADC/DAC circuit of FIG. 1.
Figure 3:
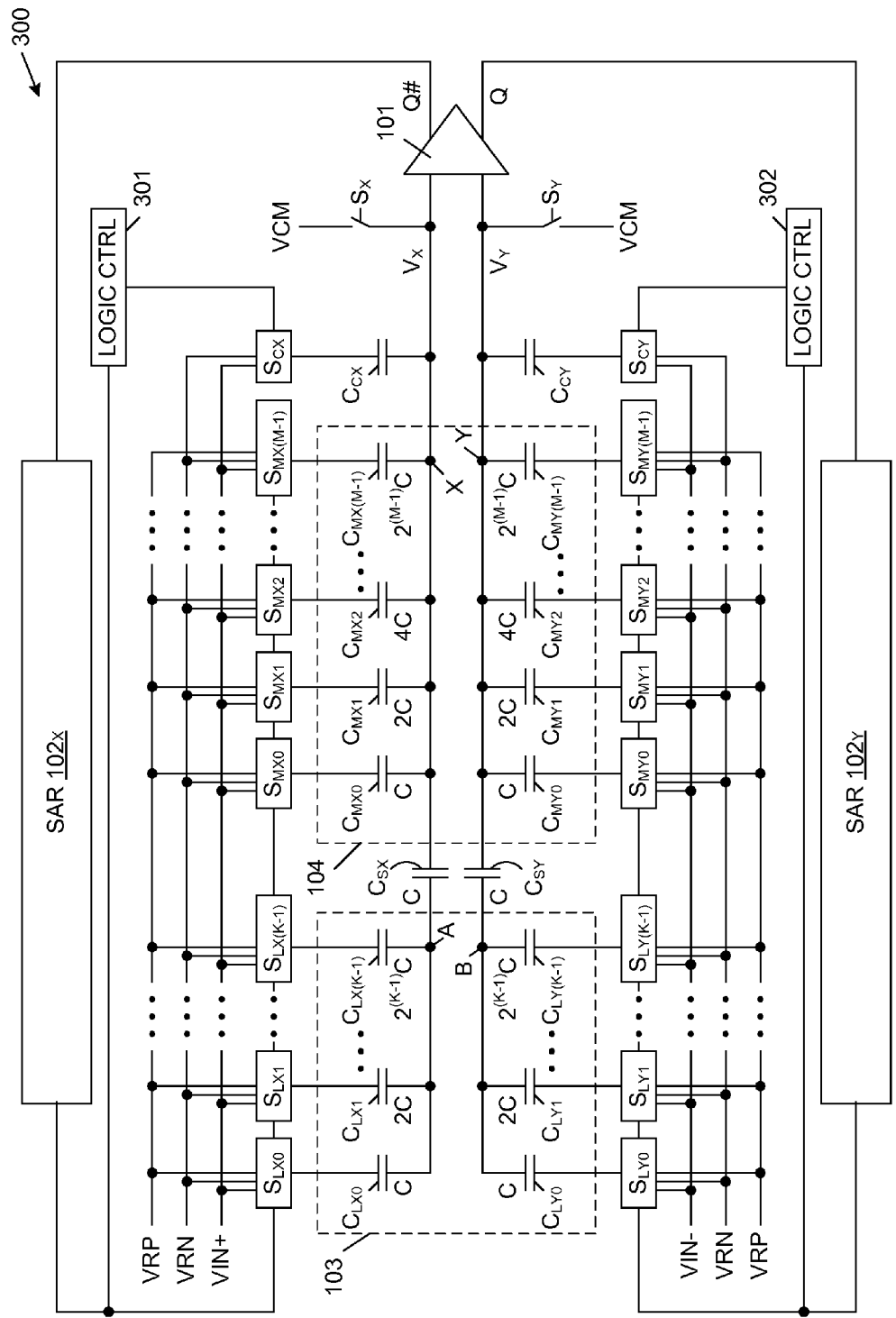
FIG. 3 is a block diagram of a differential SAR ADC/DAC circuit that includes compensation capacitors in accordance with one embodiment of the present invention.

FIG. 3 is a block diagram of an SAR ADC/DAC circuit 300 in accordance with one embodiment of the present invention. Because SAR ADC/DAC circuit 300 is similar to SAR ADC/DAC circuit 100, similar items in FIGS. 3 and 1 are labeled with similar reference numbers. Thus, SAR ADC/DAC circuit 300 includes comparator 101, SARs $102_X$ and $102_Y$, LSB capacitor section 103 (including LSB capacitors $C_{LX0}$-$C_{LX(K-1)}$ and $C_{LY0}$-$C_{LY(K-1)}$), MSB capacitor section 104 (including MSB capacitors $C_{MX0}$-$C_{MX(M-1)}$ and $C_{MY0}$-$C_{MY(M-1)}$), section coupling capacitors $C_{SX}$ and $C_{SY}$, LSB switches $S_{LX0}$-$S_{LX(K-1)}$ and $S_{LY0}$-$S_{LY(K-1)}$, MSB switches $S_{MX0}$-$S_{MX(M-1)}$ and $S_{MY0}$-$S_{MY(M-1)}$, common mode switches $S_X$ and $S_Y$, LSB output nodes A and B, and MSB output nodes X and Y, which have been described above in connection with FIG. 1.

In addition to the above-described elements, SAR ADC/DAC circuit 300 includes compensation capacitors $C_{CX}$ and $C_{CY}$, compensation capacitor switches $S_{CX}$ and $S_{CY}$, and logic control blocks 301 and 302. Note that parasitic capacitors/capacitances $C_{PA}$ and $C_{PB}$ still exist on the output nodes A and B, respectively, of LSB capacitor section 103.

Compensation capacitor $C_{CX}$ is coupled between MSB output node X and compensation capacitor switch $S_{CX}$. Similarly, compensation capacitor $C_{CY}$ is coupled between MSB output node Y and compensation capacitor switch $S_{CY}$. Compensation capacitor switches $S_{CX}$ and $S_{CY}$ are controlled by logic control blocks 301 and 302, respectively. As described in more detail below, logic control block 301 causes compensation capacitor switch $S_{CX}$ to selectively couple the associated terminal of compensation capacitor $C_{CX}$ to the input terminal VIN+, to the negative/ground reference voltage VRN, or leave this terminal of capacitor $C_{CX}$ floating, in response to the output of SAR $102_X$. Similarly, logic control block 302 causes compensation capacitor switch $S_{CY}$ to selectively couple the associated terminal of compensation capacitor $C_{CY}$ to the input terminal VIN−, to the positive reference voltage VRP, or leave this terminal of compensation capacitor $C_{CY}$ floating, in response to the output of SAR $102_Y$.

In general, SAR ADC/DAC circuit 300 operates in a manner similar to SAR ADC/DAC circuit 100, with differences noted below. During a sample mode, switches $S_X$ and $S_Y$ are closed, thereby applying a common mode voltage VCM to nodes X and Y, respectively. Switches $S_{LX0}$-$S_{LX(K-1)}$, $S_{MX0}$-$S_{MX(M-1)}$ and $S_{CX}$ are controlled to route input voltage VIN+ to capacitors $C_{LX0}$-$C_{LX(K-1)}$, $C_{MX0}$-$C_{MX(M-1)}$ and $C_{CX}$. Similarly, switches $S_{LY0}$-$S_{LY(K-1)}$, $S_{MY0}$-$S_{MY(M-1)}$ and $C_{CY}$ are controlled to route input voltage VIN− to capacitors $C_{LY0}$-$C_{LY(K-1)}$, $C_{MY0}$-$C_{MY(M-1)}$ and $C_{CY}$. As a result, capacitor sections 103 and 104, and compensation capacitors $C_{CX}$ and $C_{CY}$, sample the differential input signal represented by signals VIN+ and VIN−.

Logic control blocks 301 and 302 are coupled to receive the LSB portion of the digital signals provided by SARs $102_X$ and $102_Y$, respectively. More specifically, logic control block 301 is coupled to receive the digital signals provided by SAR $102_X$, which control LSB switches $S_{LX0}$-$S_{LX(K-1)}$. Similarly, logic control block 302 is coupled to receive the digital signals provided by SAR $102_Y$, which control LSB switches $S_{LY0}$-$S_{LY(K-1)}$. After the above-described sample mode is complete (i.e., during a hold/compare mode), if logic control block 301 determines that LSB switches $S_{LX0}$-$S_{LX(K-1)}$ all receive digital signals representative of logic '0' values, then logic control block 301 causes compensation capacitor switch $S_{CX}$ to couple the associated terminal of compensation capacitor $C_{CX}$ to the negative/ground voltage VRN. However, if logic control block 301 determines that one or more of LSB switches $S_{LX0}$-$S_{LX(K-1)}$ receive digital signals representative of a logic '1' value, then logic control block 301 causes compensation capacitor switch $S_{CX}$ to leave the associated terminal of compensation capacitor $C_{CX}$ in a floating state, effectively de-coupling the compensation capacitance from output node X.

Logic control block 302 controls compensation capacitor switch $S_{CY}$ in a manner similar to the manner in which logic control block 301 controls compensation capacitor switch $S_{CX}$. More specifically, when logic control block 302 determines that LSB switches $S_{LY0}$-$S_{LY(K-1)}$ all receive digital signals representative of logic '1' values, then logic control block 302 causes compensation capacitor switch $S_{CY}$ to couple the associated terminal of compensation capacitor $C_{CY}$ to the positive reference voltage VRP. However, if logic control block 302 determines that one or more of LSB switches $S_{LY0}$-$S_{LY(K-1)}$ receive digital signals representative of a logic '0', then logic control block 302 causes compensation capacitor switch $S_{CY}$ to leave the associated terminal of compensation capacitor $C_{CY}$ in a floating state, effectively de-coupling the compensation capacitance from output node Y.

The jump voltage $V_{JUMP}$ of SAR ADC/DAC circuit 300 can be determined as follows. The voltage $V_X$ can be represented by the following equations when all of the LSB capacitors $C_{LX0}$-$C_{LX(K-1)}$ are coupled to the positive reference voltage VRP (i.e., in logic '1' states), and all of the MSB capacitors $C_{MX0}$-$C_{MX(M-1)}$ are coupled to the negative/ground reference voltage VRN (i.e., in logic '0' states). Note that the compensation capacitor $C_{CX}$ is left floating under these conditions.

$$V_{LSB} = C_{LSB}/C_{TOT} * Vr * (2^k - 1)/(2^k - 1 + C_P) \quad \text{Eq. (15)}$$

$$V_{LSB} = Vr * (2^k - 1)/(2^{k+m} - 1 + 2^m * C_P) \quad \text{Eq. (16)}$$

Equation (16) represents the voltage $V_X$ associated with $2^K - 1$ unit capacitances C. The voltage $V_X$ associated with a single unit capacitance C can therefore be represented as follows.

$$LSB = Vr/(2^{k+m} - 1 + 2^m * C_P) \quad \text{Eq. (17)}$$

Note that equations (15, (16), and (17) are identical to equations (4), (5) and (11), above.

The voltage $V_X$ can be represented by the following equations when all of the LSB capacitors $C_{LX0}$-$C_{LX(K-1)}$ are coupled to the negative/ground reference voltage VRN (i.e., in logic '0' states), the MSB capacitor $C_{MX0}$ is coupled to the positive reference voltage VRP (i.e., in a logic '1' state), and the remaining MSB capacitors $C_{MX1}$-$C_{MX(M-1)}$ are coupled to the negative/ground reference voltage VRN (i.e., in logic '0' states). Under these conditions, switch $S_{CX}$ connects the compensation capacitor $C_{CX}$ to the negative/ground reference voltage VRN, thereby effectively enabling this compensation capacitor $C_{CX}$. In the described embodiments, the capacitance of compensation capacitor $C_{CX}$ (and compensation capacitor $C_{CY}$) is designated $C*C_C$, wherein C is the unit capacitance.

$$V_{MSB} = C/(C_{TOT} + C*C_C) * Vr \quad \text{Eq. (18)}$$

$$V_{MSB} = Vr * (2^k + C_P)/(2^{k+m} - 1 + 2^m * C_P + 2^K C_C + C_C C_P) \quad \text{Eq. (19)}$$

The term $C_C C_P$ is a relatively small value, and can therefore be ignored, resulting in the following equation.

$$V_{MSB} = Vr * (2^k + C_P)/(2^{k+m} - 1 + 2^m * C_P + 2^K C_C) \quad \text{Eq. (20)}$$

For purposes of simplification, the following substitution may be employed.

$$A = (2^{k+m} - 1 + 2^m * C_P) \quad \text{Eq. (21)}$$

Using the substitution of equation (21), equation (20) may be re-written as follows.

$$V_{MSB} = Vr * (2^k + C_P)/(A + 2^K C_C) \quad \text{Eq. (22)}$$

The jump voltage $V_{JUMP}$ can then be represented by the following equations.

$$V_{JUMP} = V_{MSB} - V_{LSB} \quad \text{Eq. (23)}$$

$$V_{JUMP} = Vr * (2^k + C_P)/(A + 2^K C_C) - Vr * (2^k - 1)/A \quad \text{Eq. (24)}$$

$$V_{JUMP} = Vr/A * (1 + (AC_P - 2^{2K} C_C)/(A + 2^k C_C)) \quad \text{Eq. (25)}$$

The difference between the jump voltage $V_{JUMP}$ and the voltage $V_X$ associated with a single unit capacitance (i.e., LSB) represents the jump error voltage, which can be defined by the following equations.

$$\Delta V_e = V_{JUMP} - LSB \quad \text{Eq. (26)}$$

$$\Delta V_e = Vr/A * (1 + (AC_P - 2^{2K} C_C)/(A + 2^k C_C)) - Vr/A \quad \text{Eq. (27)}$$

$$\Delta V_e = Vr/A * (AC_P - 2^{2K} C_C)/(A + 2^k C_C) \quad \text{Eq. (28)}$$

Equation (28) may be re-written as follows.

$$\Delta V_e = LSB * (AC_P - 2^{2K} C_C)/(A + 2^k C_C) \quad \text{Eq. (29)}$$

Equation (29) may be represented by the following approximation.

$$\Delta V_e \approx LSB * (C_P - 2^{k-m} * C_C) \quad (30)$$

In the described embodiment, k, m and $C_C$ are selected such that $(2^{k-m} * C_C)$ is approximately equal to $C_P$. For example, if parasitic capacitance value $C_P = C$, k=6, and m=6, then the compensation capacitance value $C_C$ would be selected to be approximately equal to C. Equation (30) indicates that the compensation capacitor $C_{CX}$ reduces the jump error voltage $\Delta V_e$ compared to the prior art, as long as the compensation capacitance value $C_C$ is properly selected in view of the parasitic capacitance value $C_P$, and the values k and m. In accordance with one embodiment, the jump error voltage $\Delta V_e$ is eliminated, such that SAR ADC/DAC circuit 300 advantageously exhibits a linear response for all SAR codes. Note that if k is less than m, then $C_C$ can be increased to minimize $\Delta V_e$. Conversely, if k is greater than m, then $C_C$ can be reduced to minimize $\Delta V_e$.

Figure 4:
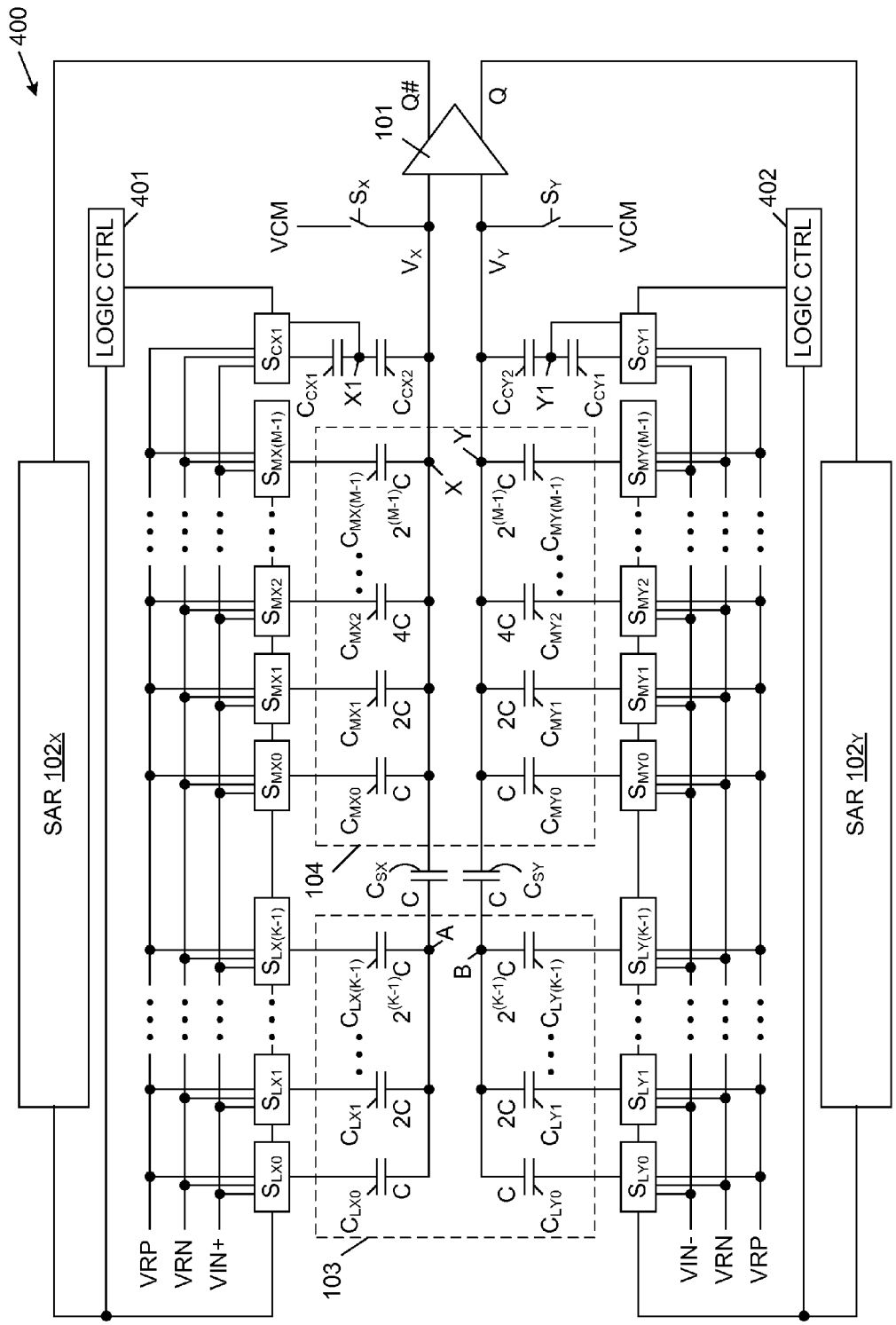
FIG. 4 is a block diagram of a differential SAR ADC/DAC circuit that includes series-connected compensation capacitors in accordance with another embodiment of the present invention.

In accordance with one embodiment of the present invention, the compensation capacitors $C_{CX}$ and $C_{CY}$ are each replaced by series-connected capacitors. FIG. 4 is a block diagram of an SAR ADC/DAC circuit 400, which replaces the compensation capacitors $C_{CX}$ and $C_{CY}$ of SAR ADC/DAC circuit 300 with series-connected capacitors $C_{CX1}$-$C_{CX2}$ and $C_{CY1}$-$C_{CY2}$, respectively. Capacitors $C_{CX1}$-$C_{CX2}$ are connected in series between the MSB output node X and compensation capacitor switch $S_{CX1}$. Similarly, capacitors $C_{CY1}$-$C_{CY2}$ are connected in series between the MSB output node Y and compensation capacitor switch $S_{CY1}$. The common node of capacitors $C_{CX1}$-$C_{CX2}$ is labeled as node X1, and the common node of capacitors $C_{CY1}$-$C_{CY2}$ is labeled as node Y1. Logic control blocks 401 and 402 control compensation capacitor switches $S_{CX1}$ and $S_{CX2}$, respectively, in the manner described below.

It is initially noted that SAR ADC/DAC circuit 400 can operate in the same manner as SAR ADC/DAC circuit 300. That is, logic control blocks 401 and 402 may couple compensation capacitors $C_{CX2}$ and $C_{CY2}$ (i.e., nodes X1 and Y1) to the various voltages VIN+, VIN−, VRN and VRP (or leave these compensation capacitors $C_{CX2}$ and $C_{CY2}$ in floating states) in the same manner that logic control blocks 301 and 302 couple compensation capacitors $C_{CX}$ and $C_{CY}$ to the various voltages VIN+, VIN−, VRN and VRP (or leave these compensation capacitors $C_{CX}$ and $C_{CY}$ in floating states). When operating SAR ADC/DAC circuit 400 in this manner, logic control blocks 401 and 402 leave the compensation capacitors $C_{CX1}$ and $C_{CY1}$ in floating states.

Alternately, logic control blocks 401 and 402 may leave nodes X1 and Y1 in floating states, such that capacitors $C_{CX1}$ and $C_{CX2}$ are coupled in series between the output node X and a terminal selected by switch $S_{CX1}$ (and capacitors $C_{CY1}$ and $C_{CY2}$ are coupled in series between the output node Y and a terminal selected by switch $S_{CY1}$). In this embodiment, series-connected capacitors $C_{CX1}$-$C_{CX2}$ can be viewed as a single capacitor, which has a capacitance less than $C_{CX2}$ by itself. Similarly, series-connected capacitors $C_{CY1}$-$C_{CY2}$ can be viewed as a single capacitor, which has a capacitance less than $C_{CY2}$ by itself. Operating SAR ADC/DAC 400 in this manner effectively reduces the compensation capacitances introduced at the output terminals X and Y.

Logic control blocks 401 and 402 may therefore adjust the compensation capacitances introduced at the output terminals X and Y, by controlling the operation of switches $S_{CX1}$ and $S_{CY1}$. Thus, the compensation capacitances may be adjusted, as necessary, to more effectively cancel the jump error voltage $\Delta Ve$.

In accordance with yet another embodiment, logic control blocks 401 and 402 may operate compensation capacitor switches $S_{CX1}$ and $S_{CY1}$ such that nodes X1 and Y1 are coupled to receive the respective input signals VIN+ and VIN− during a sample phase (and compensation capacitors $C_{CX1}$ and $C_{CY1}$ are left floating during this sample phase). After the sample phase is complete (i.e., during a hold/compare phase), logic control blocks 401 and 402 leave nodes X1 and Y1 in floating states, such that capacitors $C_{CX1}$ and $C_{CX2}$ are coupled in series between the output node X and a terminal selected by switch $S_{CX1}$ (and capacitors $C_{CY1}$ and $C_{CY2}$ are coupled in series between the output node Y and a terminal selected by switch $S_{CY1}$). In this configuration, series-connected capacitors $C_{CX1}$-$C_{CX2}$ can be viewed as a single capacitor, which has a capacitance less than $C_{CX2}$. Similarly, series-connected capacitors $C_{CY1}$-$C_{CY2}$ can be viewed as a single capacitor, which has a capacitance less than $C_{CY2}$.

The hold/compare phase proceeds in the same manner described above in connection with SAR ADC/DAC 300. That is, if logic control block 401 determines that LSB switches $S_{LX0}$-$S_{LX(K-1)}$ all receive digital signals representative of logic '0' values, then logic control block 401 causes compensation capacitor switch $S_{CX1}$ to couple compensation capacitor $C_{CX1}$ to the negative/ground voltage VRN (and leave the common node X1 floating), thereby coupling the compensation capacitors $C_{CX1}$ and $C_{CX2}$ in series between the MSB output node X and the negative/ground voltage VRN.

However, if logic control block 401 determines that one or more of LSB switches $S_{LX0}$-$S_{LX(K-1)}$ receive digital signals representative of a logic '1' value, then logic control block 401 causes compensation capacitor switch $S_{CX1}$ to leave both compensation capacitor $C_{CX1}$ and common node X1 in a floating state, effectively de-coupling the compensation capacitors $C_{CX1}$ and $C_{CX2}$ from output node X. Logic control block 402 controls compensation capacitor switch $S_{CY1}$ in the same manner that logic control block 401 controls compensation capacitor switch $S_{CX1}$.

Figure 5:
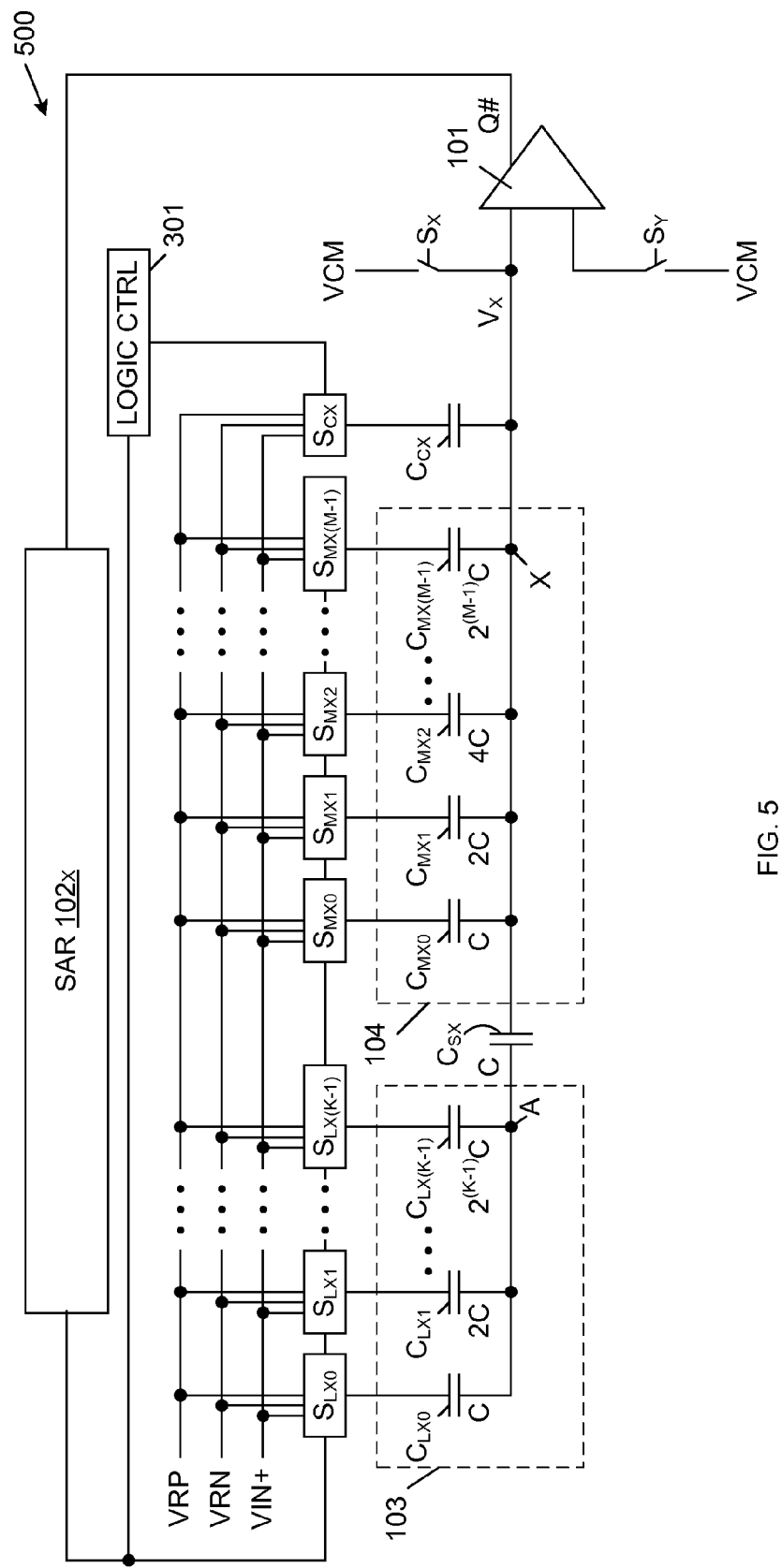
FIG. 5 is a block diagram of a single-ended SAR ADC/DAC circuit that includes compensation capacitors in accordance with another embodiment of the present invention.
Figure 6:
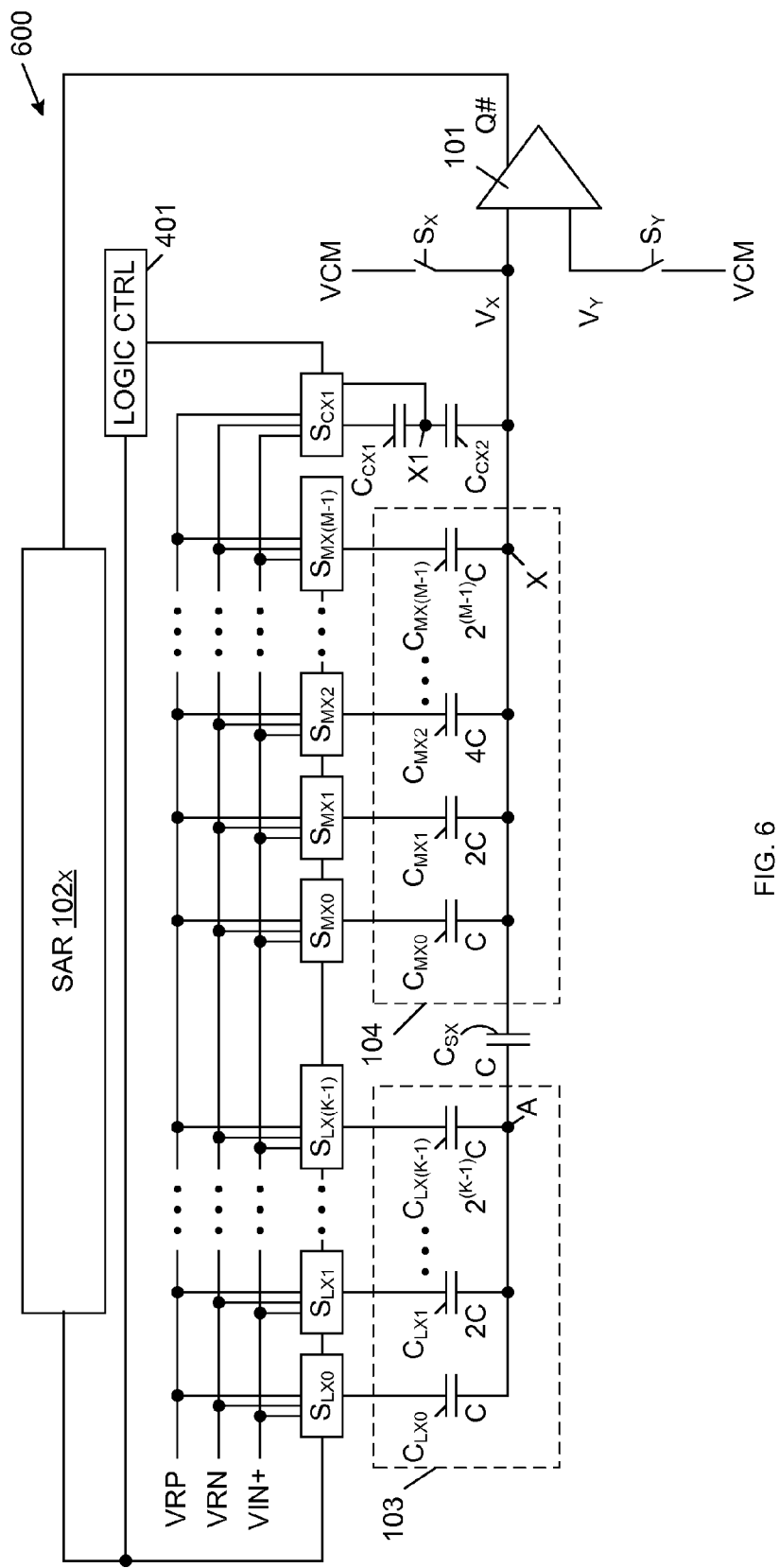
FIG. 6 is a block diagram of a single-ended SAR ADC/DAC circuit that includes series-connected compensation capacitors in accordance with another embodiment of the present invention.

Although FIGS. 3 and 4 illustrate differential SAR ADC/DAC circuits 300 and 400, respectively, it is understood that the present invention can also be applied to single-ended SAR ADC/DAC circuits. FIGS. 5 and 6 are block diagrams of single ended SAR ADC/DAC circuits 500 and 600, respectively, in accordance with alternate embodiments of the present invention. Because SAR ADC/DAC circuits 500 and 600 are similar to SAR ADC/DAC circuits 300 and 400, similar elements in FIGS. 3, 4, 5 and 6 are labeled with similar reference numbers.

Figure 7:
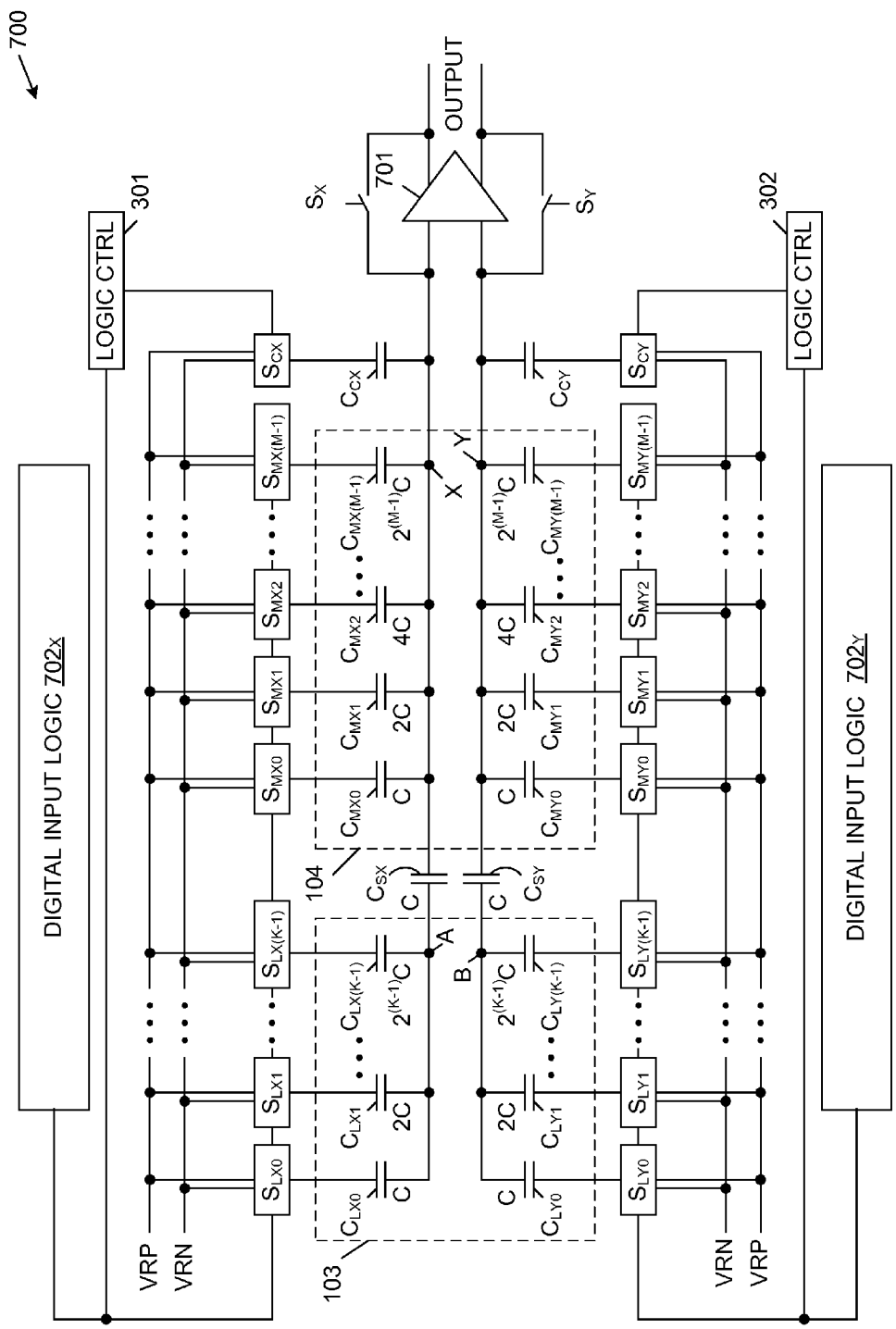
FIG. 7 is a block diagram of a differential charge scaling DAC that includes compensation capacitors in accordance with one embodiment of the present invention.

The present invention can also be applied to charge scaling digital-to-analog converters (DACs). FIG. 7 is a block diagram of a differential charge scaling DAC 700 in accordance with one embodiment of the present invention. Similar elements in FIGS. 3 and 7 are labeled with similar reference numbers. Charge scaling DAC 700 replaces the comparator 101 of SAR ADC/DAC circuit 300 with an operational amplifier 701, which is connected as illustrated. Charge scaling DAC 700 replaces the SARs $102_X$-$102_Y$ of SAR ADC/DAC circuit 300 with digital input logic blocks $702_X$-$702_Y$. Digital input logic blocks $702_X$-$702_Y$ supply digital signals to switches $S_{LX0}$-$S_{LX(K-1)}$, $S_{MX0}$-$S_{MX(M-1)}$, $S_{LY0}$-$S_{LY(K-1)}$ and $S_{MY0}$-$S_{MY(M-1)}$, which are representative of an analog output signal (OUTPUT) to be generated. Logic control blocks 301 and 302 operate in response to the digital signals provided by digital input logic blocks $702_X$-$702_Y$, in the manner described above in connection with FIG. 3.

Figure 8:
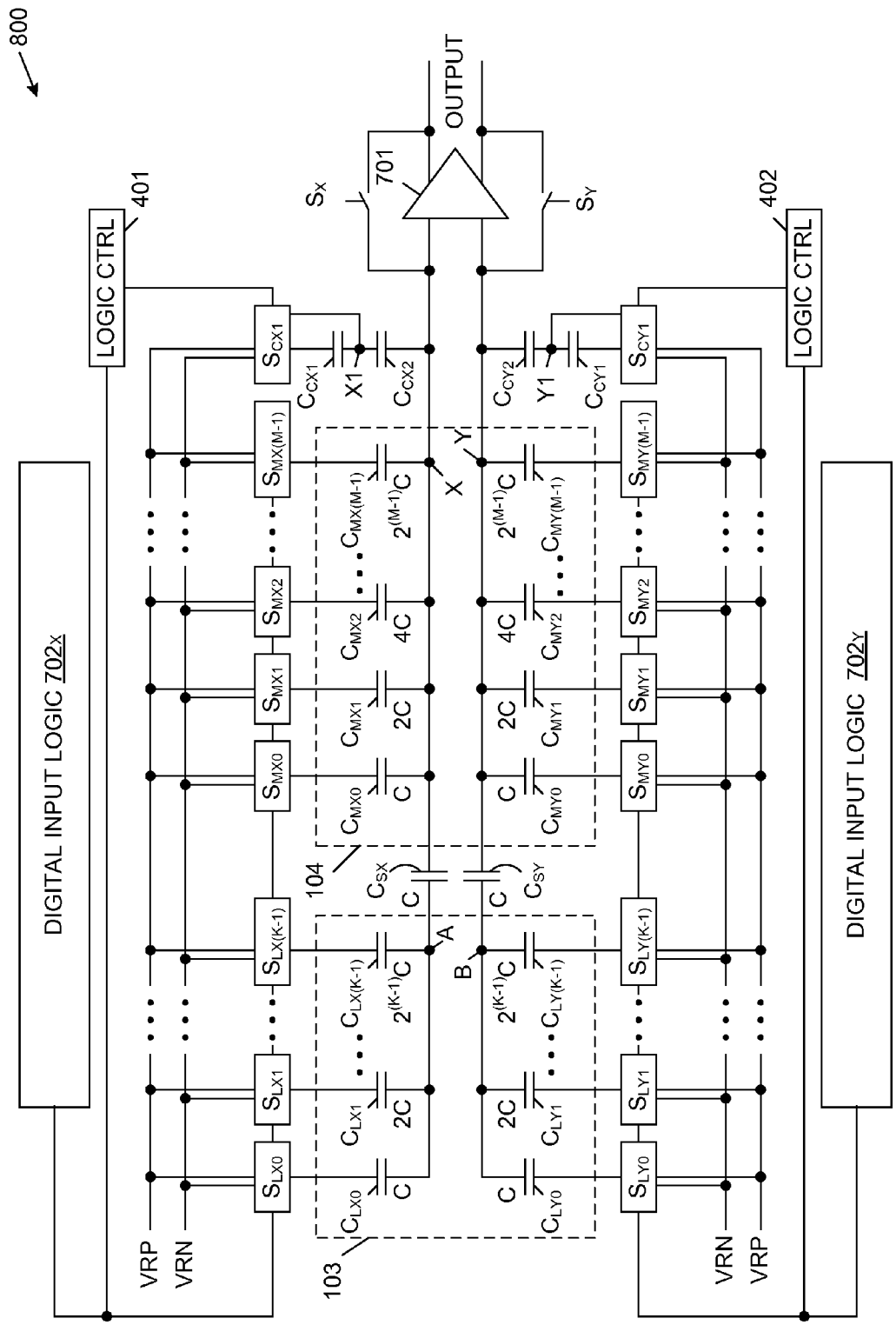
FIG. 8 is a block diagram of a differential charge scaling DAC that includes series-connected compensation capacitors in accordance with one embodiment of the present invention.

FIG. 8 is a block diagram of a charge scaling DAC 800, which replaces the logic control blocks 301-302, compensation capacitor switches $S_{CX}$-$S_{CX}$ and compensation capacitors $C_{CX}$-$C_{CY}$, of charge scaling DAC 700 with logic control blocks 401-402, compensation capacitor switches $S_{CX1}$-$S_{CX2}$ and compensation capacitors $C_{CX1}$-$C_{CX2}$ and $C_{CY1}$-$C_{CY2}$. The operation of logic control blocks 401-402, compensation capacitor switches $S_{CX1}$-$S_{CX2}$ and compensation capacitors $C_{CX1}$-$C_{CX2}$ and $C_{CY1}$-$C_{CY2}$ is described in detail above in connection with FIG. 4.

Figure 9:
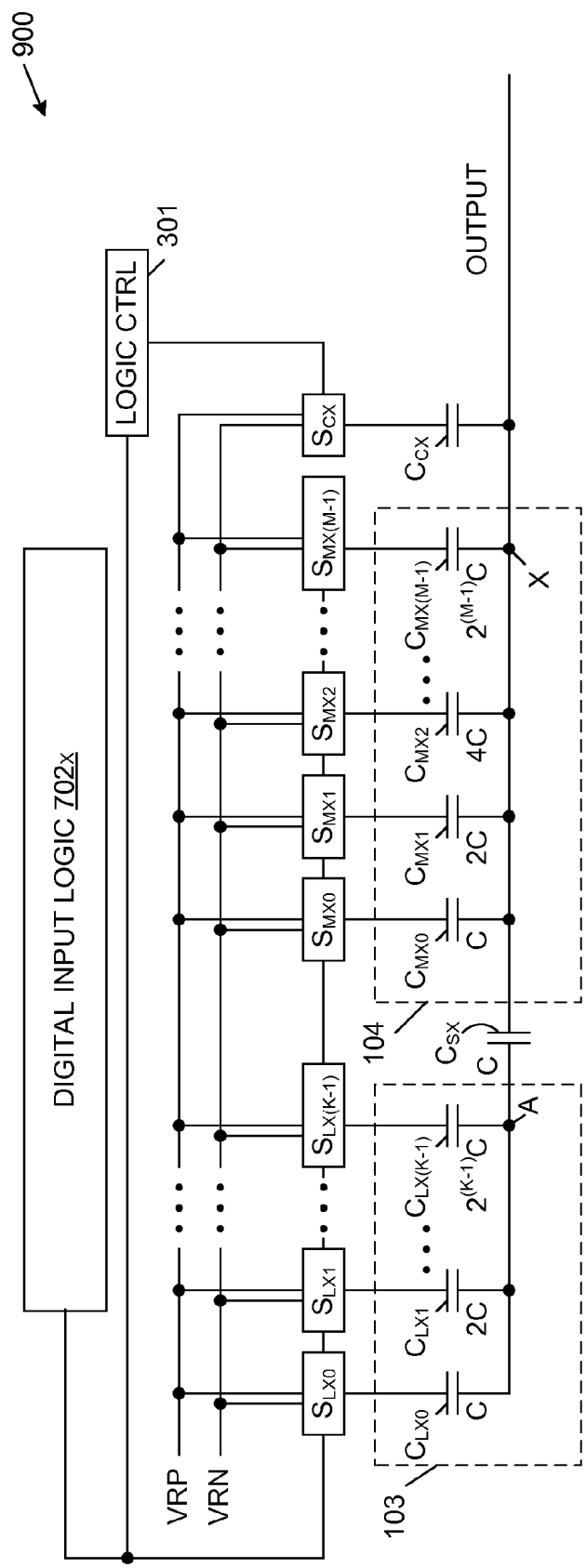
FIG. 9 is a block diagram of a single-ended charge scaling DAC that includes compensation capacitors in accordance with one embodiment of the present invention.

FIG. 9 is a block diagram of a single-ended charge scaling DAC 900 in accordance with yet another embodiment of the present invention. Because charge scaling DAC 900 is similar to charge scaling DAC 700, similar elements in FIGS. 7 and 9 are labeled with similar reference numbers. Single-ended charge scaling DAC 900 operates in a manner similar to differential charge scaling DAC 700.

Figure 10:
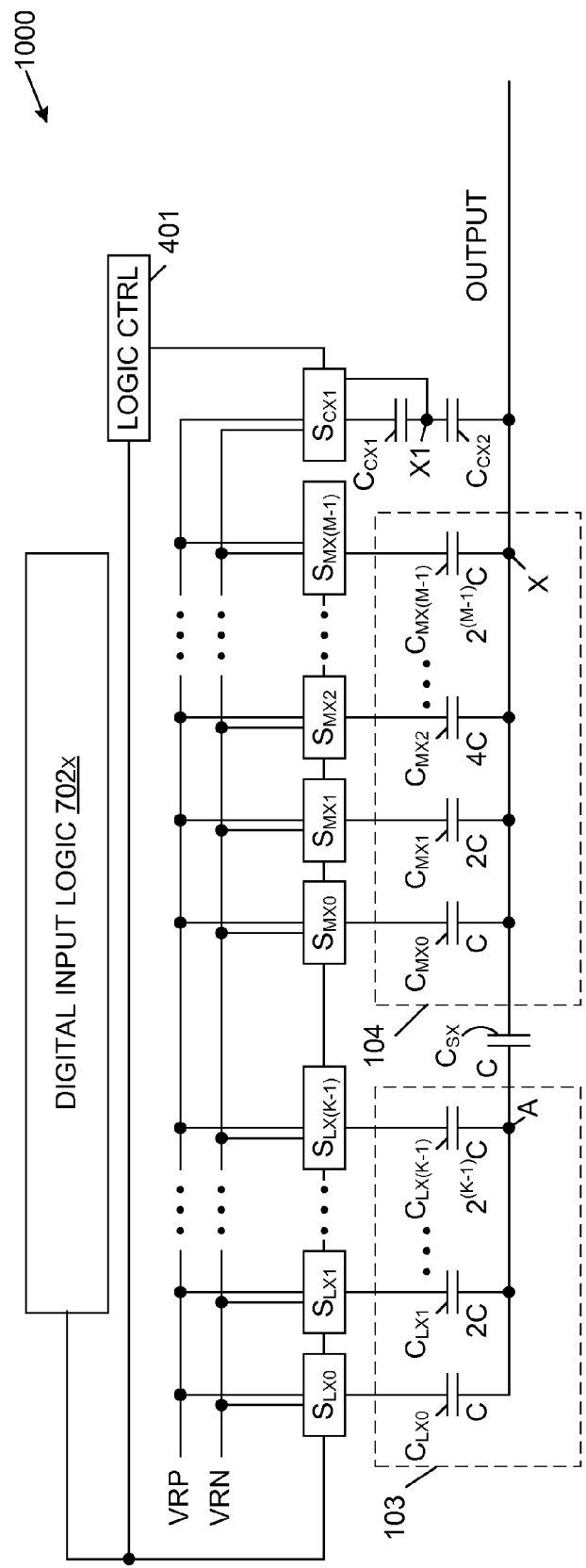
FIG. 10 is a block diagram of a single-ended charge scaling DAC that includes series-connected compensation capacitors in accordance with one embodiment of the present invention.

FIG. 10 is a block diagram of a single-ended charge scaling DAC 1000 in accordance with another embodiment of the present invention. Because charge scaling DAC 1000 is similar to charge scaling DAC 800, similar elements in FIGS. 8 and 10 are labeled with similar reference numbers. Single-ended charge scaling DAC 1000 operates in a manner similar to differential charge scaling DAC 800.

Although the present invention has been described in connection with various embodiments, it is understood that variations of these embodiments would be obvious to one of ordinary skill in the art. For example, although the present invention has been described in connection with binary-weighted capacitors, it is understood that the present invention is equally applicable to systems that implement non-binary weighted capacitors. Thus, the present invention is limited only by the following claims.

We claim:

1. A digital-to-analog converter (DAC) circuit comprising:
a first set of capacitors, each commonly coupled to a first node, wherein the first node exhibits a parasitic capacitance;
a second set of capacitors, each commonly coupled to an output node;
a section-coupling capacitor coupled in series between the first node and the output node;
a compensation capacitor coupled to the output node, wherein the compensation capacitor has a compensation capacitance selected to offset an error voltage introduced by the parasitic capacitance; and
a compensation capacitor switch coupled to the compensation capacitor, wherein the compensation capacitor switch includes a first position that couples the compensation capacitor to a reference voltage, and a second position that leaves the compensation capacitor in a floating state.

2. The DAC circuit of claim 1, further comprising:
a first set of switches coupled to the first set of capacitors; and
a second set of switches coupled to the second set of capacitors, wherein the first and second sets of switches are coupled to receive digital input voltages.

3. The DAC circuit of claim 2, wherein the first and second sets of switches are further coupled to receive an analog input signal.

4. The DAC circuit of claim 1, further comprising a comparator coupled to the output node.

5. The DAC circuit of claim 1, wherein the first set of capacitors have binary-weighted capacitances and the second set of capacitors have binary-weighted capacitances.

6. The DAC circuit of claim 1, wherein the first set of capacitors include a plurality of binary-weighted capacitors, wherein a smallest one of the binary-weighted capacitors has a unit capacitance C, and wherein the section-coupling capacitor has a capacitance equal to the unit capacitance C.

7. The DAC circuit of claim 6, wherein the second set of capacitors includes a plurality of binary-weighted capacitors, wherein a smallest one of the binary-weighted capacitors in the second set of capacitors has the unit capacitance C.

8. A digital-to-analog converter (DAC) circuit comprising:
a first set of capacitors, each commonly coupled to a first node, wherein the first node exhibits a parasitic capacitance;
a second set of capacitors, each commonly coupled to an output node;
a section-coupling capacitor coupled in series between the first node and the output node;
a compensation capacitor coupled to the output node, wherein the compensation capacitor has a compensation capacitance selected to offset an error voltage introduced by the parasitic capacitance;
a first set of switches coupled to the first set of capacitors;
a second set of switches coupled to the second set of capacitors, wherein the first and second sets of switches are coupled to receive digital input voltages, wherein the first set of switches are controlled to provide a first set of digital input voltages to the first set of capacitors;
a switch coupled to the compensation capacitor; and
a logic control block that controls the switch in response to the first set of digital input voltages provided to the first set of capacitors.

9. A digital-to-analog converter (DAC) circuit comprising:
a first set of capacitors, each commonly coupled to a first node, wherein the first node exhibits a parasitic capacitance, and wherein the first set of capacitors have binary-weighted capacitances;
a second set of capacitors, each commonly coupled to an output node, wherein the second set of capacitors have binary-weighted capacitances;
a section-coupling capacitor coupled in series between the first node and the output node;
a compensation capacitor coupled to the output node, wherein the compensation capacitor has a compensation capacitance selected to offset an error voltage introduced by the parasitic capacitance, wherein there are k binary-weighted capacitors in the first set of capacitors and m binary-weighted capacitors in the second set of capacitors, wherein a capacitance $C_C$ of the compensation capacitor is selected such that $2^{k-m}*C_C$ is approximately equal to the parasitic capacitance.

10. A digital-to-analog converter (DAC) circuit comprising:
a first set of capacitors, each commonly coupled to a first node, wherein the first node exhibits a parasitic capacitance;
a second set of capacitors, each commonly coupled to an output node;
a section-coupling capacitor coupled in series between the first node and the output node;
a compensation capacitor coupled to the output node, wherein the compensation capacitor has a compensation capacitance selected to offset an error voltage introduced by the parasitic capacitance;
a second compensation capacitor having a first electrode and a second electrode, wherein the first electrode is coupled to the compensation capacitor; and
a compensation capacitor switch block coupled to the first electrode and the second electrode of the second compensation capacitor.

11. The DAC circuit of claim 10, further comprising a logic control block that controls the compensation capacitor switch block in response to a first set of digital input voltages provided to the first set of capacitors.

12. A method of performing digital to analog conversion comprising:
applying a first set of digital input signals to a first set of capacitors that are commonly coupled to a first node, wherein the first node exhibits a parasitic capacitance;
applying a second set of digital input signals to a second set of capacitors that are commonly coupled to an output node, wherein a section-coupling capacitor couples the first node to the output node;
selectively coupling and de-coupling a compensation capacitor structure to the output node in response to the first set of digital input signals.

13. The method of claim 12, further comprising:
coupling the compensation capacitor structure between the output node and a ground terminal when all of the digital input signals in the first set of digital input signals represent logic '0' values.

14. The method of claim 13, further comprising placing a terminal of the compensation capacitor structure in a floating state when one or more of the digital input signals in the first set of digital input signals represents a logic '1' value.

15. The method of claim 13, further comprising selecting a compensation capacitance of the compensation capacitor structure such that the compensation capacitance offsets the parasitic capacitance when the compensation capacitor structure is coupled between the output node and the ground terminal.

16. The method of claim 12, further comprising adjusting a compensation capacitance of the compensation capacitor structure.

17. The method of claim 16, wherein the step of adjusting comprises changing a number of series-connected capacitors in the compensation capacitor structure.

* * * * *